United States Patent
Correale, Jr. et al.

(10) Patent No.: US 6,762,638 B2
(45) Date of Patent: Jul. 13, 2004

(54) CIRCUIT FOR PRESERVING DATA IN A FLIP-FLOP AND A METHOD OF USE

(75) Inventors: Anthony Correale, Jr., Raleigh, NC (US); William James Goodall, III, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/065,228

(22) Filed: Oct. 16, 2002

(65) Prior Publication Data

US 2004/0075478 A1 Apr. 22, 2004

(51) Int. Cl.[7] ............................................. H03K 3/289
(52) U.S. Cl. ........................ 327/202; 327/203; 327/204
(58) Field of Search ................................. 327/202, 203, 327/204; 326/40, 93

(56) References Cited

U.S. PATENT DOCUMENTS 5,777,489 A * 7/1998 Barbier et al. ................ 326/40
6,433,586 B2 * 8/2002 Ooishi ........................... 326/93

* cited by examiner

Primary Examiner—Tuan T. Lam
Assistant Examiner—Hiep Nguyen
(74) Attorney, Agent, or Firm—Sawyer Law Group, LLP; Scott W. Reid

(57) ABSTRACT

A method and a flip-flop is disclosed in which power consumption is reduced in a standby mode. In a first aspect, the flip-flop comprises a first latch adapted to be coupled to a first power supply and a second latch coupled to the first latch and adapted to be coupled to a second power supply. The first and second power supplies are independently controllable to minimize power consumption in a standby mode. In a second aspect, a method for minimizing the power consumption of a flip-flop is also disclosed. The flip-flop includes a first latch and a second latch coupled thereto. The method comprises providing a first independently controllable power supply coupled to the master latch; and providing a second independently controllable power supply coupled to the slave latch. The method further includes reducing the voltage of at least one of the first and second power supplies responsive to the detection of a power saving mode.

25 Claims, 10 Drawing Sheets

CIRCUIT FOR PRESERVING DATA IN A FLIP-FLOP AND A METHOD OF USE

CROSS REFERENCE TO RELATED APPLICATIONS

The present application is related to application Ser. No. 10/065,226, filed on even date herewith, and entitled "Method and Circuit for Optimizing Power Consumption in a Flip-Flop."

FIELD OF THE INVENTION

The present invention relates to logic circuits, and more particularly to a circuit for preserving state in a flip-flop during a power saving mode.

BACKGROUND OF THE INVENTION

Most VLSI designs have numerous flip-flops integrated within them. Typically, flip-flops are critical to the overall performance of this design. Conventional flip-flops are generally large, power hungry and a significant amount of time is spent optimizing their configuration. It is desirable therefore to minimize the power used by flip-flops in a circuit design. In a flip-flop design, as technologies get smaller, it is harder to control the amount of leakage current provided thereby. Therefore, it is desirable to make device sizes smaller within the flip-flop at the same time being able to preserve the state of whatever contents are within the flip-flop. It is known that one way to save power is to shut off sections of the design. For example, one way to save power is to utilize clock gating to disable the clock when it is not used. Also, in an effort to save or minimize standby power, some designs have resorted to disabling non-used sections of the design from the power supply. However, disabling the power supply generally results in a loss of stored data in the volatile memory elements.

One solution for this problem is to transfer the data or state of the latch to an on-chip memory before the latch is disconnected from the power supply. Examples of chip memory include SRAM, DRAM or flash memory. This technique, however, requires an auxiliary device to preserve the state, which adds cost and adds to the overall size of the design of the device.

Accordingly, what is needed is a method and circuit for preserving data in a flip-flop while also conserving power. The method and circuit should also be cost effective, save space, and easily implemented in existing circuit designs. The present invention addresses such needs.

SUMMARY OF INVENTION

A flip-flop is disclosed in which power consumption is reduced in a standby mode. In a first aspect, the flip-flop comprises a first latch adapted to be coupled to a first power supply and a second latch coupled to the first latch and adapted to be coupled to a second power supply. The first and second power supplies are independently controllable to minimize power consumption in a standby mode.

In a second aspect, a flip-flop comprises a first latch adapted to be coupled to a first power supply. The first latch receives at least one bit. The flip-flop includes a second latch coupled to the first latch and adapted to be coupled to a second power supply. The second latch stores the at least one bit from the first latch. The size of the second latch is minimized to reduce power consumption. The flip-flop also includes a multiplexor coupled to the first latch and to the second latch for outputting the at least one bit from the first latch when a clock to the multiplexor is active and for outputting the at least one bit from the second latch when the clock is inactive. The first and second power supplies are independently controllable.

In a third aspect, a method for minimizing the power consumption of a flip-flop is also disclosed. The flip-flop includes a first latch and a second latch coupled thereto. The method comprises providing a first independently controllable power supply coupled to the master latch; and providing a second independently controllable power supply coupled to the slave latch. The method further includes reducing the voltage of at least one of the first and second power supplies responsive to the detection of a power saving mode.

An additional feature of the present invention is a restore mechanism which multiplexes the data and an output of a slave latch of a master/slave FF to enable recovery of the state of the contents of the master latch.

Finally, another feature of the present invention is a state latch which is coupled to the second power supply and is only activated upon detection of standby power saving mode to retain the contents of the master latch.

Hence, a simple means to optimize power consumption in random logic latch configurations with or without clock gating has been disclosed. According to the method and circuit disclosed herein, the present invention provides numerous benefits. For example, it preserves the data in a FF during a power savings mode.

DETAILED DESCRIPTION

The present invention relates to logic circuits, and more particularly to a method and circuit for preserving data in a flip-flop during a power saving mode. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
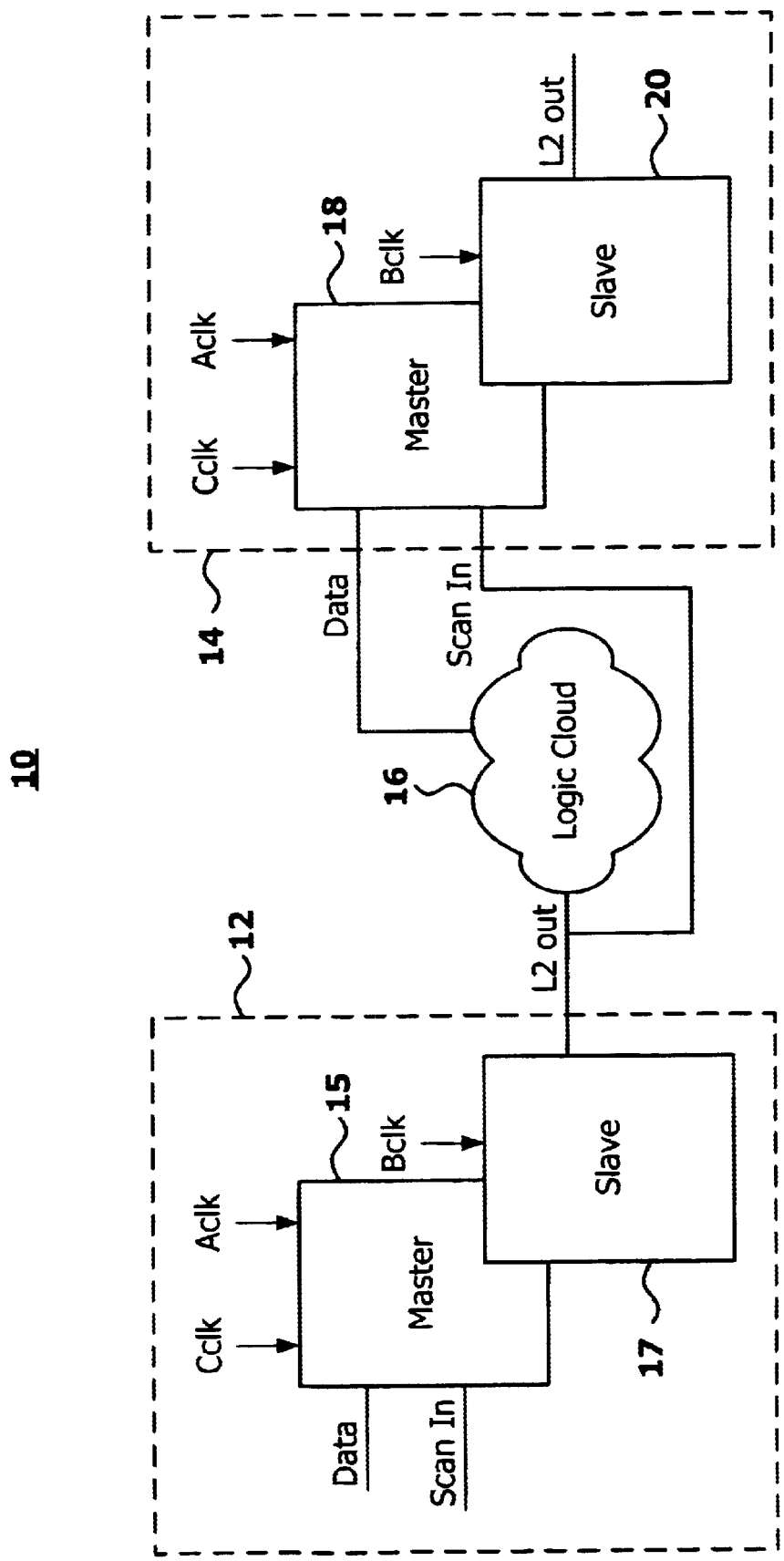
FIG. 1 illustrates a conventional logical configuration employing a pair of L1/L2 master/slave latches coupled to logic.

FIG. 1 illustrates a conventional logical configuration 10 employing a pair of L1/L2 master/slave FFs 12 and 14 coupled to logic 16. In this embodiment, the content of the second L1 18 will be consistent with logic 16 and the content of the first L2 17 upon reactivation of the clock C2 in an un-gated clocking methodology. The logic is designed between the L2 stage of one FF12 and the L1 stage of the other of master FF14. The Shift Register chain is formed by connecting the L2 output of one SRL to the Scan in of another. The Cycle Time is designed from the launch of clock C2 to fall of clock C1.

Figure 2:
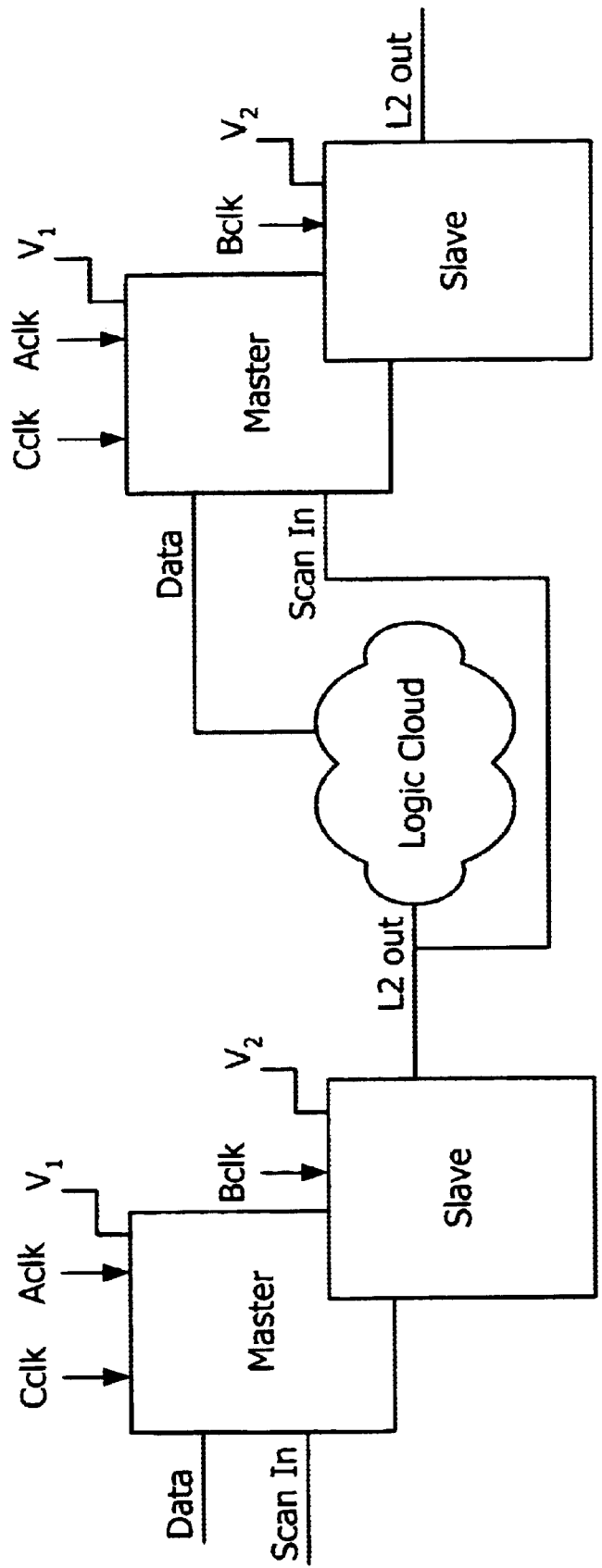
FIG. 2 illustrates a conventional logical configuration with voltage supplies, V1 and V2, connected to the master latch and the slave latch respectively

In the conventional logical configuration, each of the slave-master FF 12 and 14 typically has one power supply connected thereto that controls the overall voltage. In a first aspect of the present invention, each of the flip-flop pairs would have an independent voltage supply coupled thereto. FIG. 2 illustrates a conventional logical configuration 100 with voltage supplies, V1 and V2, connected to the master latch and the slave latch respectively. Each of the voltage supplies is independently controllable. They could, in fact, be of the same voltage level therefore. When a power-saving is encountered and the clocks are disabled, at least one of the voltage supplies can be reduced from its full value to a minimum value, and the latch then is retaining the state of the contents could be kept at a value to sustain the state. In so doing, the overall power consumption of the logical configuration will be significantly reduced.

Figure 3:
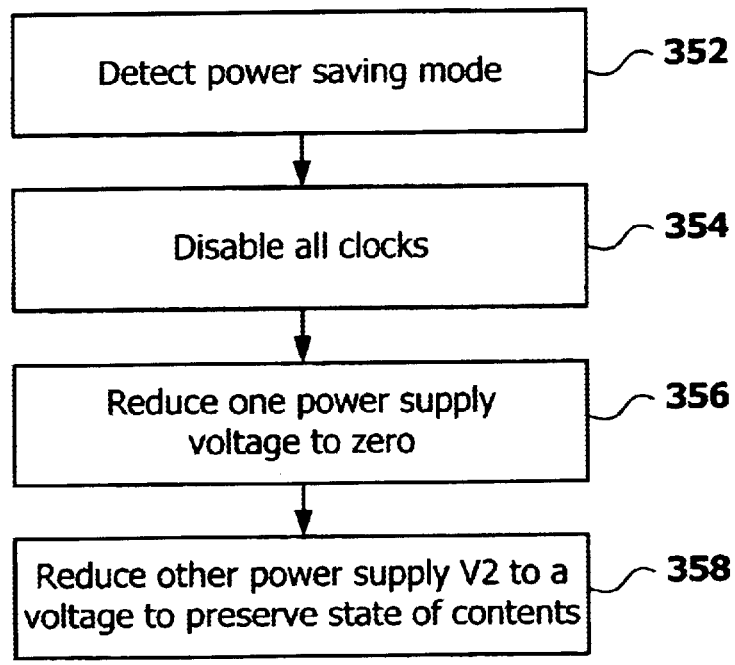
FIG. 3 is a flow chart showing a method for conserving standby power in a logical configuration of FIG. 2.

FIG. 3 is a flow chart showing a method for conserving standby power in a logical configuration of FIG. 2. First, a power saving mode is detected via step 352. Next, all clocks related to the flip-flop are disabled via step 354. Next, the voltage supply related to one of the flip-flops is reduced to zero, via step 356. Finally, the other of the two voltage supplies is reduced to a voltage which will preserve the state of contents of the other of the flip-flops, via step 358.

By way of providing independently controllable voltage supplies on each of the master latch and slave latch of the FF, the standby power and therefore leakage current of a conventional master/slave flip-flop arrangement is significantly reduced. However, it is desirable to be able to further reduce the standby power while also preserving the state of the contents of the device. For a further description of the problem with conventional flip-flops in conserving power refer now to the following discussion in conjunction with FIG. 4.

Figure 4:
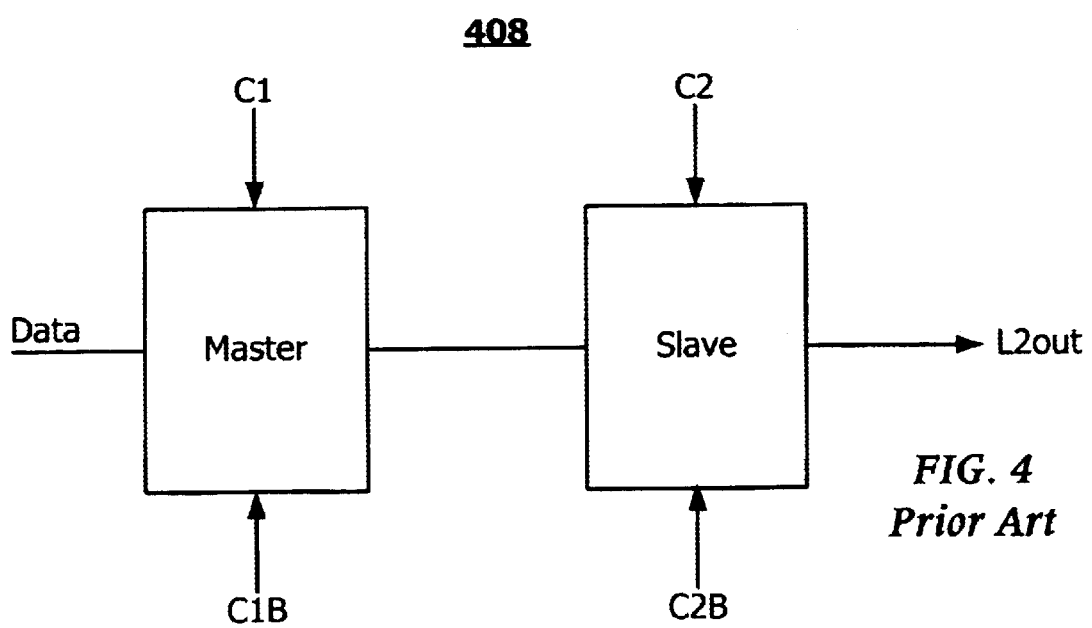
FIG. 4 is a block diagram of a conventional master-slave flip-flop (FF).

FIG. 4 is a block diagram of a conventional master-slave flip-flop (FF) 408. The FF 408 includes a master latch 410 and a slave latch 412. In operation, the master latch 410 receives data (labeled "data"), a clock pulse C1, and a clock set pulse C1 B. The slave latch 412 receives a clock pulse C2 and a clock set pulse C2B. The slave latch 412 outputs the data (labeled "L2 out"). The clock pulse C1 is driven by a clock C1. Similarly, the clock pulse C2 is driven by a clock C2.

With regard to performance, there are set-up criteria for the master latch and launch criteria for the slave latch. The sum of the set up criteria and the launch criteria provide the most performance critical information. The objective is to minimize the time needed to transfer data from the master latch 410 to the slave latch 412. Various latching configurations can be employed, but all generally use a write-thru-read approach. That is, the architecture of the slave latch 412 is such that it stores the incoming data while it is outputting the data. For more performance, the device sizes of the slave latch 412 are generally large enough to support high-speed data transfer. As such, the large device sizes result in increased capacitance and larger area, hence they consume more power.

Co-pending U.S. patent application Ser. No. 10/065,226, filed on even date herewith, and entitled "Method and Circuit for Optimizing Power Consumption in a Flip-Flop," which is incorporated in its entirety herein, discloses a flip-flop in which power consumption is substantially minimized. The features of the flip-flop are described below in conjunction with the accompanying figures.

Figure 5A:
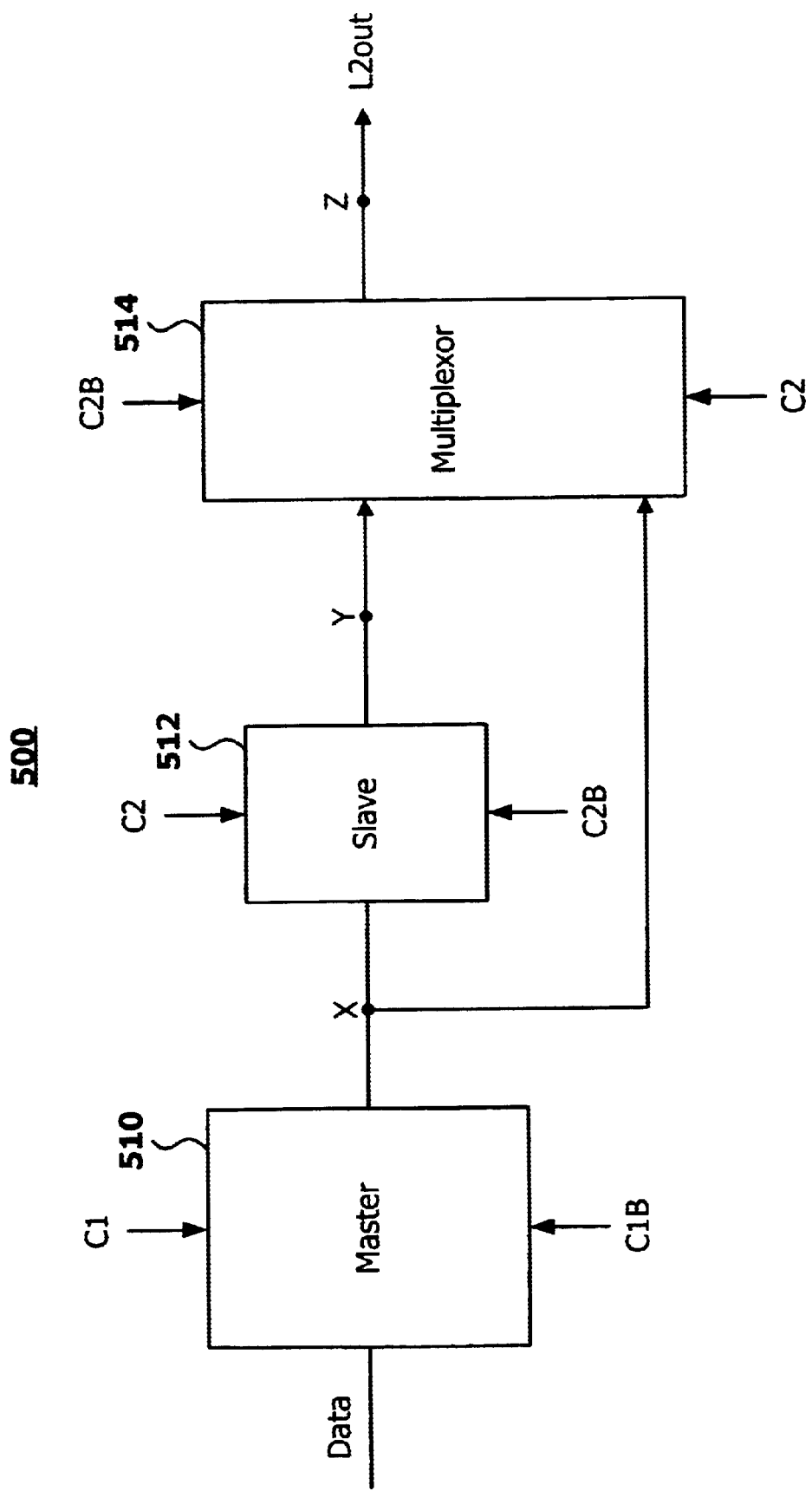
FIG. 5A is a high-level block diagram of the FF in accordance with that application.

FIG. 5A is a high-level block diagram of the FF 500 in accordance with that application. The FF 500 includes a master latch 510, a slave latch 512, and a multiplexor 514. As is seen, X, Y and Z nodes are identified. The actual configuration of the master latch 510 and the slave latch 512 can vary and will depend on the specific embodiment. In this embodiment, the multiplexor 514 is a shunt multiplexor.

Because the slave latch 512 does not serve a performance-critical function, it can be implemented utilizing minimum sized devices. By minimizing the size of the devices within the slave latch, the leakage current and the operating current is significantly reduced as compared to the larger conventional slave latch. As a result, the overall power consumption of the FF 500 is optimized.

Figure 5B:
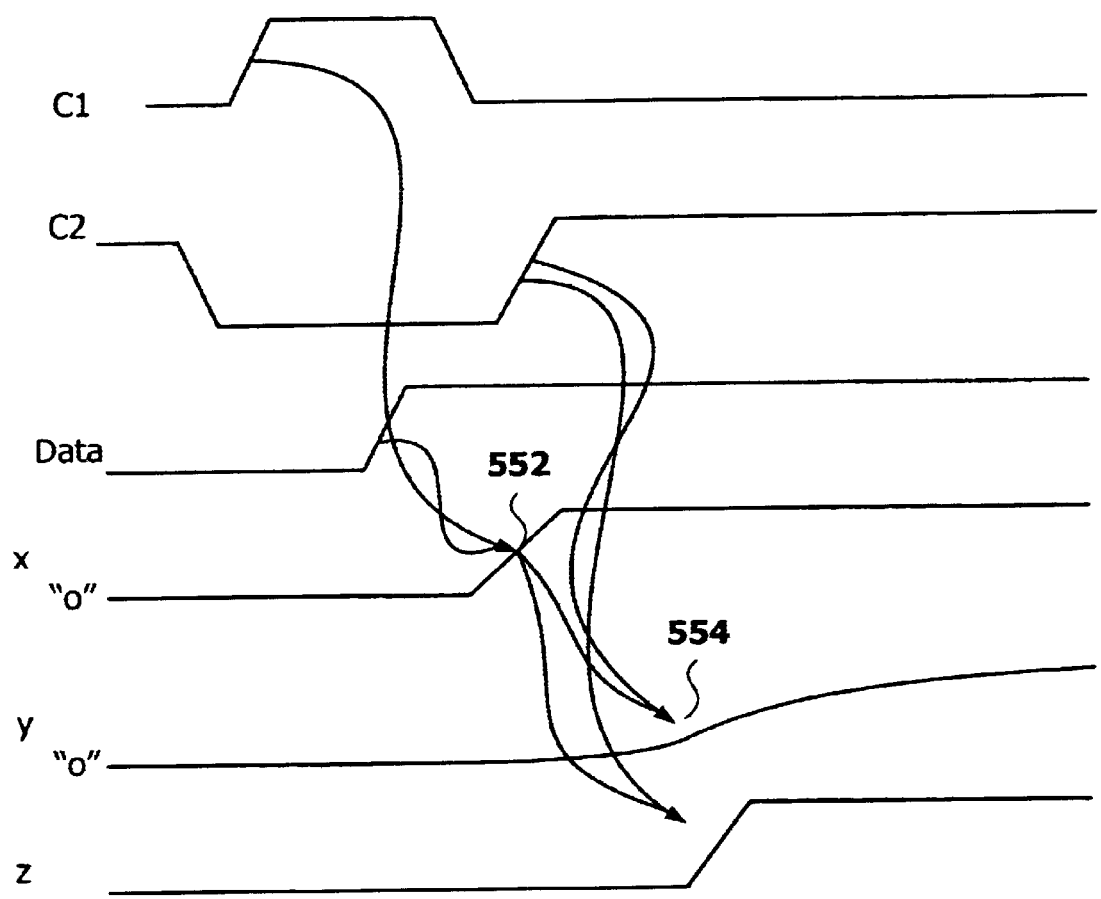
FIG. 5B is a timing diagram showing the various signals of FF of FIG. 4A

FIG. 5B is a timing diagram showing the various signals of FF 500 of FIG. 5A. As is seen, clock C1 is shown as a first waveform, clock C2 is shown as a second waveform, and data is shown as a third waveform. As is also seen, the waveforms of the X, Y and Z nodes are shown. Referring now to both FIGS. 5A and 5B together, when the data is received by the master latch 510, it is passed to node X when the clock C1 goes high. The data is received by both the slave latch 512 and the multiplexor 514. Assuming the previous states of nodes Y and Z were a logical low, the state at both nodes Y and Z go high (shown in FIG. 5B at 552 and 554, respectively) when the clock C2 goes high. As shown in the timing diagram, node Z changes at a significantly faster rate than does node Y. The signal at node Y changes at a slower rate than the signal at node Z because the slave latch 512 includes gates therewithin that consume less power since the slave latch 512 uses all minimum devices. The slave latch can be designed in this manner because it is not in the performance critical path.

Utilizing the flip-flop 500, the slave latch 512 is not involved in the critical performance, and the device sizes there within can be a minimum size. In addition, the slave latch 512 can now be coupled to an auxiliary power supply rather than a main power supply. Therefore, a system and method in accordance with the present invention utilizes a power-consumption optimized flip-flop in conjunction with a dual-voltage system in which the state of the contents can be preserved while a power supply is disabled. In so doing, standby power can be substantially reduced while preserving the state of the contents. For a more detailed description of the features of this portion of the present invention, refer now to the following discussion in conjunction with the accompanying figures.

Figure 6:
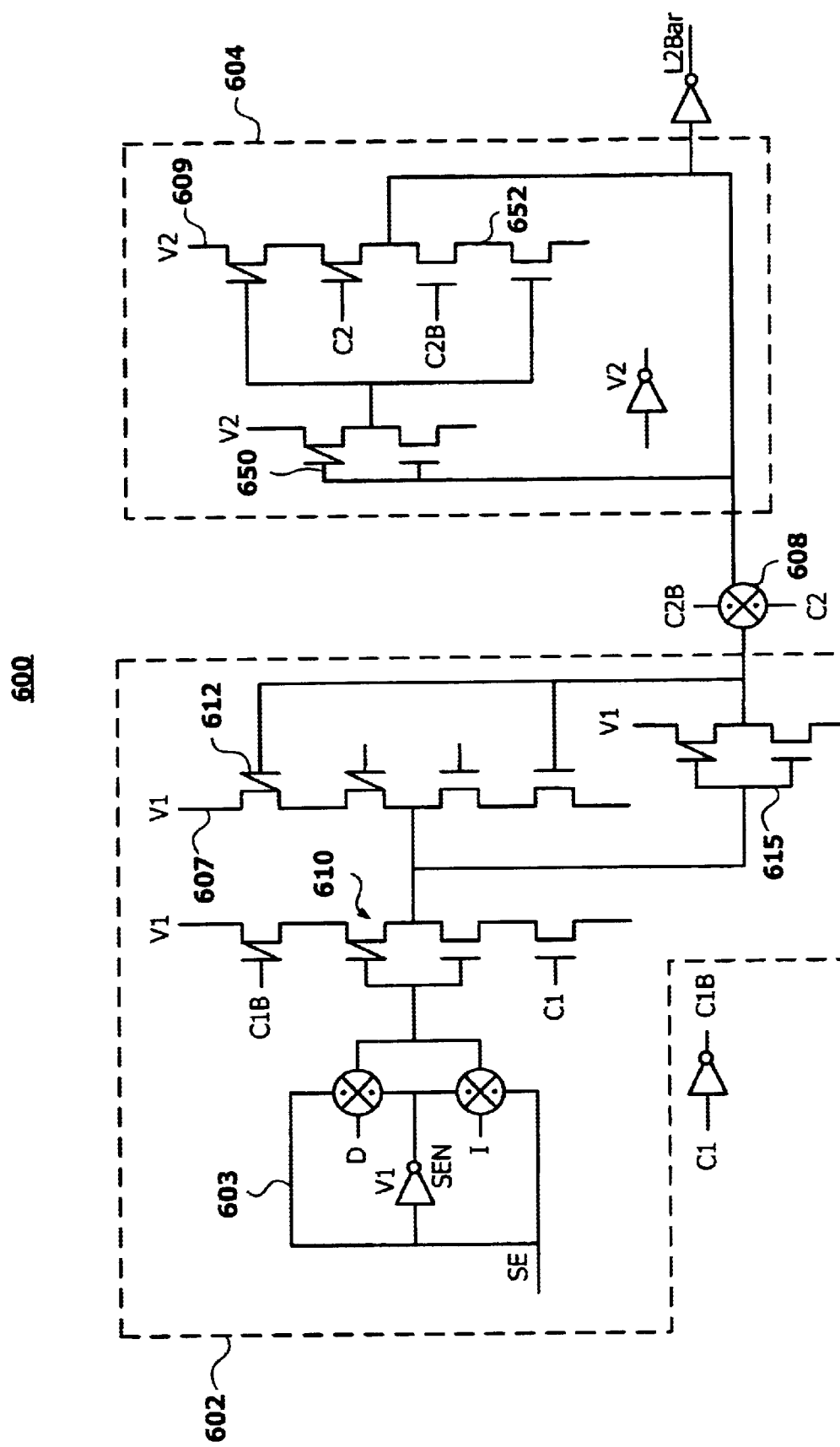
FIG. 6 is a schematic diagram of a master-slave FF, in accordance with the present invention.

FIG. 6 is a schematic diagram of a master-slave FF 600, in accordance with the present invention. The FF 600 includes a master latch 602 that is coupled to a slave latch 604. The master latch 602 is coupled to a first voltage supply 607 and the slave latch 604 is coupled to a second voltage supply 609.

In the master latch 602, the parallel connected pair of transmission devices 603 forms a first multiplexor there within. Depending upon the state of the SE signal, either the D (data) input or the I (scan) input will be presented to the master latch 602 for loading when the clock C1 is activated. The clusters of transistors comprising the master latch 602 are as follows: two sets of four device series configuration of two series pfets and two series nfets whose respective outputs are at the pfet-nfet junction shown at 610 and 612, respectively, and an inverter 615. These two sets 610 and 612 of four devices have their outputs commoned and have their respective controls swapped and thus act as a multiplexor. The first series set 610 passes the inverse of the value presented from the transmission gate pair 603 (D or I mux) when the clock C1 is active. The second set 612 is inactive when the first set 610 is active and vice-versa to provide the appropriate contents to the output. When the clock C1 is inactive, the first set 610 is essentially tri-stated and blocks the input choice from changing the content of the latch. The second set 612 activates and provides the necessary feedback to form the latch. The slave latch 604 comprises the two transistor pair 650 which is coupled to a set of four transistors 652.

The transmission device 608 between the master and slave latches 602 and 604, respectively, which has its nfet and pfet gate nodes connected to clock C2 and clock C2B, respectively, transfers the content held in the master latch 602 to the slave latch 604 when the clock C2 and clock C2B are active; otherwise, the two latches are isolated from one another.

The basic premise is that the voltage supply 607 can be reduced to 0-volts when a static power saving mode is to be entered, while voltage supply 609 will be kept at a sufficient bias to maintain the state of the latch. Since the master latch is comprised larger performance devices, shutting off the voltage supply 607 will result in significant standby/leaking current reduction. The slave latch 604 is comprised of all minimum devices and as such results in far less leakage relative to the master latch 602. If additional leakage reduction is desired, the voltage supply 609 can be reduced to a level that allows the slave latch 604 to retain value at less leakage. Note also that the clock C2 inverter is also connected to the voltage supply 609, whereas the clock C1 circuitry and the clock C1 generation circuitry are coupled to the supply at voltage supply 607.

The FF 600 can be utilized to advantage when different clock gating configurations are used. The use of FF 600 in each of these configurations will be described in detail herein below.

The specific clock-gating configuration will vary and will depend on the specific application. For example, there can be four different clock-gating embodiments as follows:

Case A: the clock C2 and the clock C1 are free running;
Case B: the clock C2 is gated and the clock C1 is free running;
Case C: the clock C2 is free running and the clock C1 is gated; and
Case D: the clock C1 and the clock C2 are gated.

The present invention readily applies to the embodiments of Cases A, B, C, and D.

Case A: The Clock C2 and the Clock C1 are Free Running:

Referring back to FIG. 6, for example, in Case A, both the clock C1 and the clock C2 are free running, and as such, the content of the master latch 602 and the slave latch 604 are the same at the conclusion of the cycle. Hence, if the cycle is initiated by the arrival of a launch or the clock C2 pulse, and if the cycle is terminated by a capture or the clock C1 pulse, the content of both the master latch 602 and the slave latch 604 will be the same on the arrival of the next clock C2 pulse.

After the arrival of the next clock C2 pulse, the steps for power saving described above can be applied. The master latch 602 will lose its content. The slave latch 604, however, will retain its content.

Upon awakening from the power saving mode, power is restored to voltage supply 607. Also, the voltage supply 609 is restored to its full value, if its voltage had been decreased to reduce leakage. Upon satisfactory restoration of the power supplies, the clock C1 is activated, thereby restoring the prior state in the master latch 602 from the slave latch 604.

Case B: The Clock C2 as Gated and the Clock C1 as Free Running.

The embodiments of Case B operate similarly to those embodiments of Case A. Referring still to FIG. 6, because the clock C2 is gated, the master latch 602 contains valid data from a prior cycle. Upon awakening from a standby power saving mode, i.e., returning to a normal mode, the master latch 602 is reloaded with its prior content from the logic being fed by another slave latch (not illustrated), which is located logically upstream from the master latch 602.

Case C: The Clock C2 is Free Running and the Clock C1 is Gated.

Figure 7:
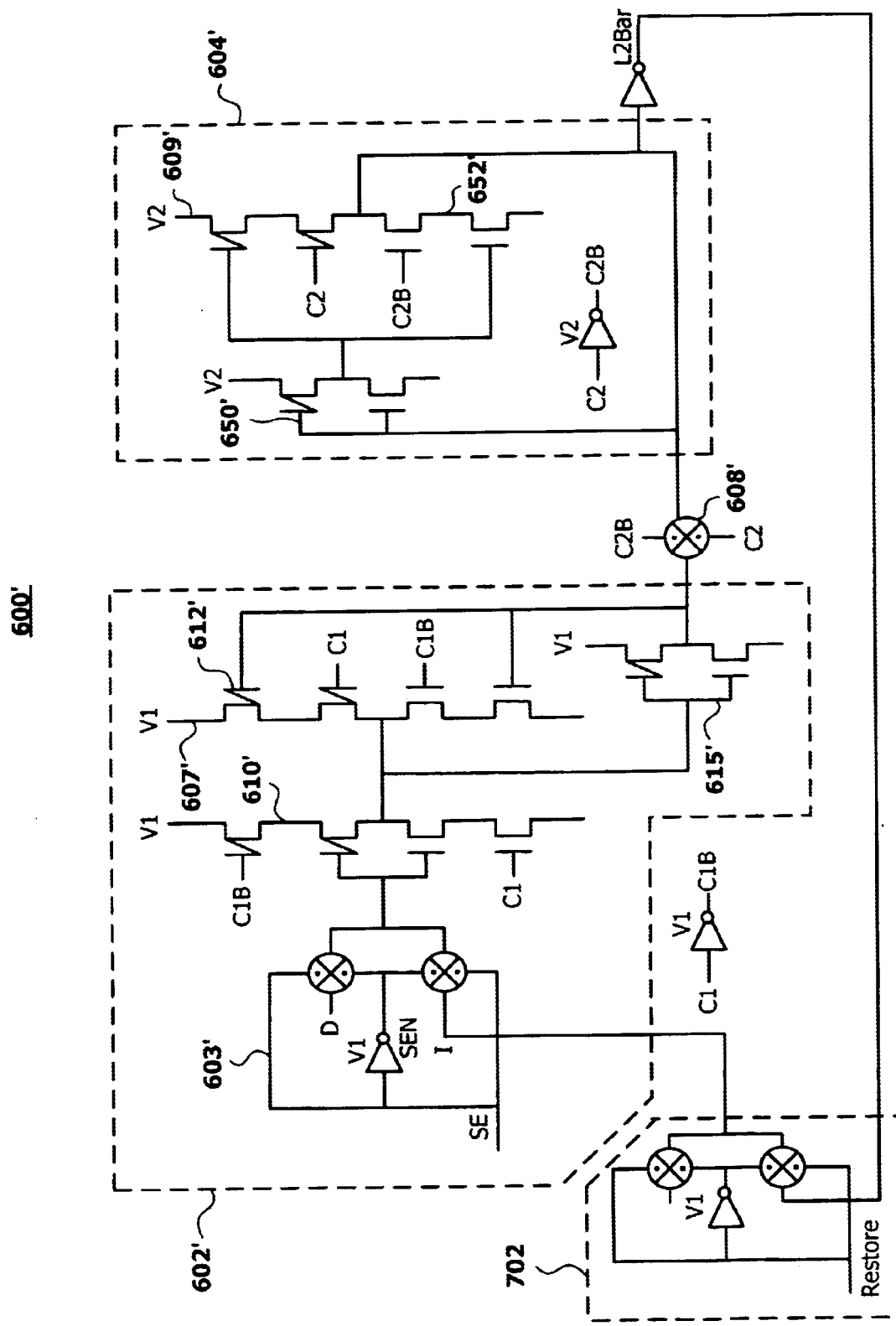
FIG. 7 is a schematic diagram of a master-slave FF which includes an additional multiplexor.

FIG. 7 is a schematic diagram of a master-slave FF 600' which includes an additional multiplexor 702. The slave latch 604' is refreshed by the master latch 602' on each cycle, regardless of whether the content of the master latch 602' has changed. To enable recovery of the state of the master latch 602' after a power down cycle of the voltage supply 607', the logic configuration includes a restore feature. This restore feature employs the multiplexor 702, which multiplexes the normal data and the output of the slave latch 604'. The multiplexor 702 can multiplex a LSSD scan input and the output of the slave latch 604' to provide higher performance. The size of all these devices can be minimized because they do not impact performance.

The slave latch 604' retains its state in standby mode. Upon awakening from the standby power saving mode, before the clocks can be reactivated, a restore signal goes active to steer the content of the slave latch 604' into the multiplexor 702. The multiplexor 702 can be configured to steer either a scan input or the slave latch 604' output to the scan input of the master latch 602' as is illustrated in FIG. 7. An alternative approach could use multiplexor 702 to steer either primary data or the slave latch 604' output to the data input (D) of the master latch 602'. This choice will depend upon the specific application. In the example cited and illustrated in FIG. 7, the restore signal is activated along with the scan enable (SE) before the C1 clock is activated. Upon successful restoration of the slave latch 604', the restore signal and SE can be disabled.

Case D: The Clock C1 and the Clock C2 are Gated.

Figure 8:
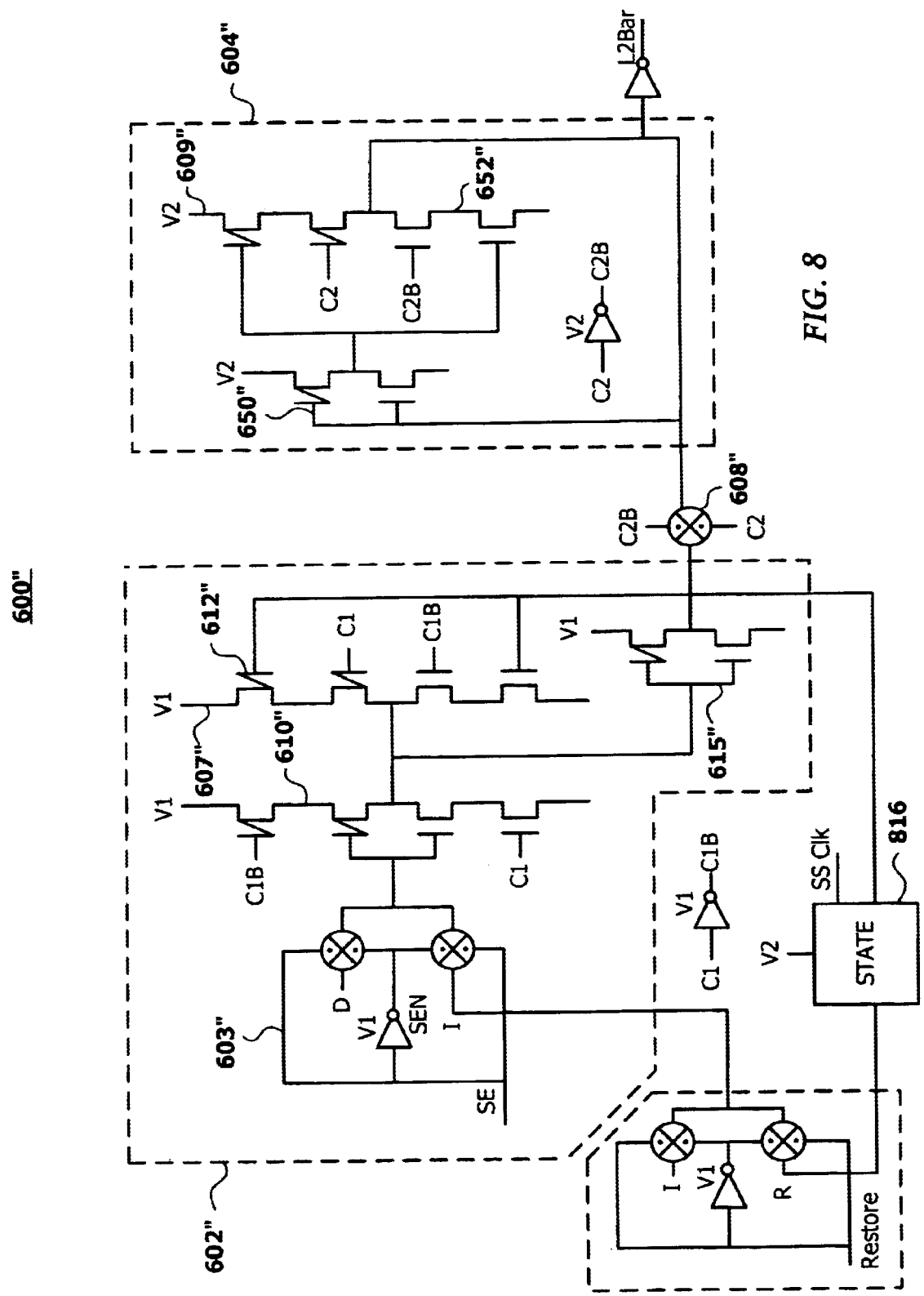
FIG. 8 is a schematic diagram of a master-slave FF' which includes a state latch in accordance with the present invention.

FIG. 8 is a schematic diagram of a master-slave FF 600" which includes a state latch 816 in accordance with the present invention. In case D, the local content of the master latch 602" can be different from the content of the slave latch 604". Accordingly, Case D is more complex than Cases A–C. The state latch 816 is coupled to the V2 supply and is only activated upon detection of standby power saving mode. In fact, state latch 816 can be coupled to the voltage supply 609" through a header switch to eliminate active power in normal, functional mode. Also, the state latch 816 has minimum-sized device geometries.

The master-slave FF 600" operates in a functional mode no differently than without the state saving condition. The feedback components include the multiplexor 702' and the state latch 816. In one embodiment, the multiplexor 702' and the state latch 816 can be integrated to save space. They can also share resources. Also, the content of the master latch 602" can be different from the content of the slave latch 604". Also, the contents of both the master latch 602" and the slave latch 604" are preserved. The state latch 816 is activated by a state saving clock signal upon detection of entry into a power saving mode.

Figure 9:
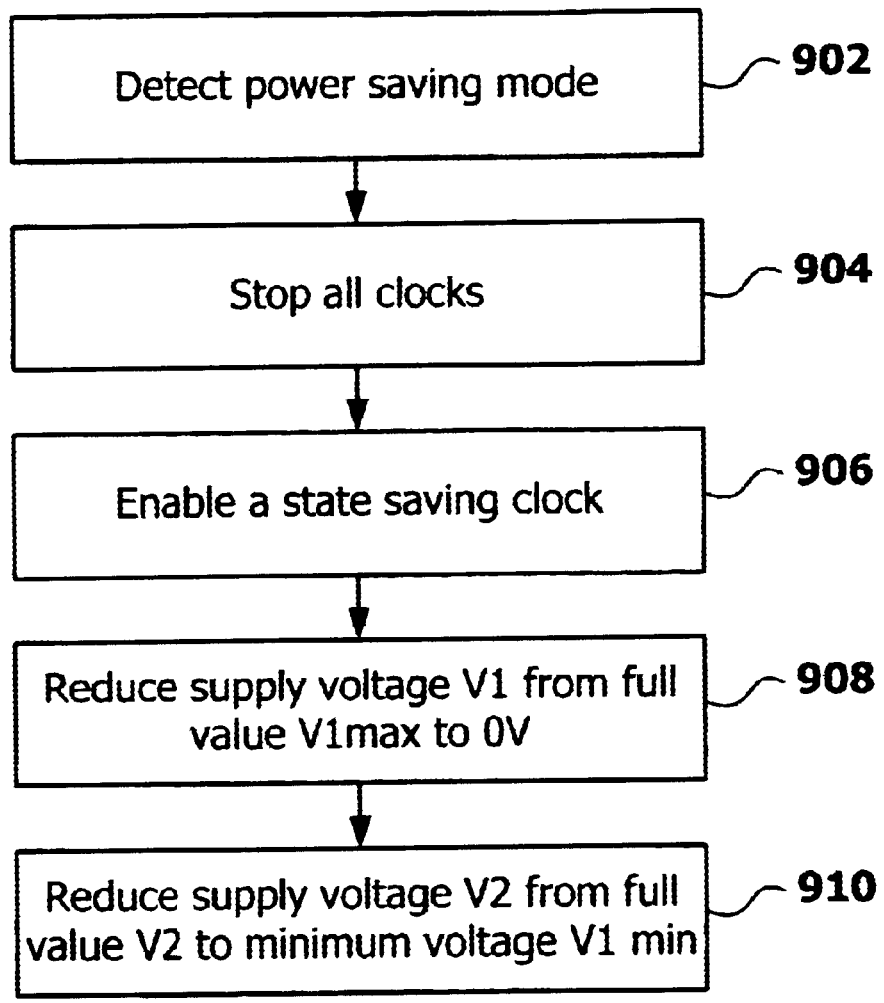
FIG. 9 is a flowchart which illustrates a method enabling power saving mode utilizing FF.

FIG. 9 is a flowchart which illustrates a method enabling power saving mode utilizing FF 600". A power saving mode is detected, via step 902. Next, all clocks are stopped, via step 904. Then, a state saving clock is enabled to load the master latch contents into the state latch 816, via step 906. Next, the supply voltage 607' is reduced from its full value V1 max to 0V, via step 908. Finally, the supply voltage 609" is reduced from its full value V2max to a minimum voltage V1 min to sustain the state, via step 910. (Note that the specific value of Vmin will vary and will depend on the specific application.

Figure 10:
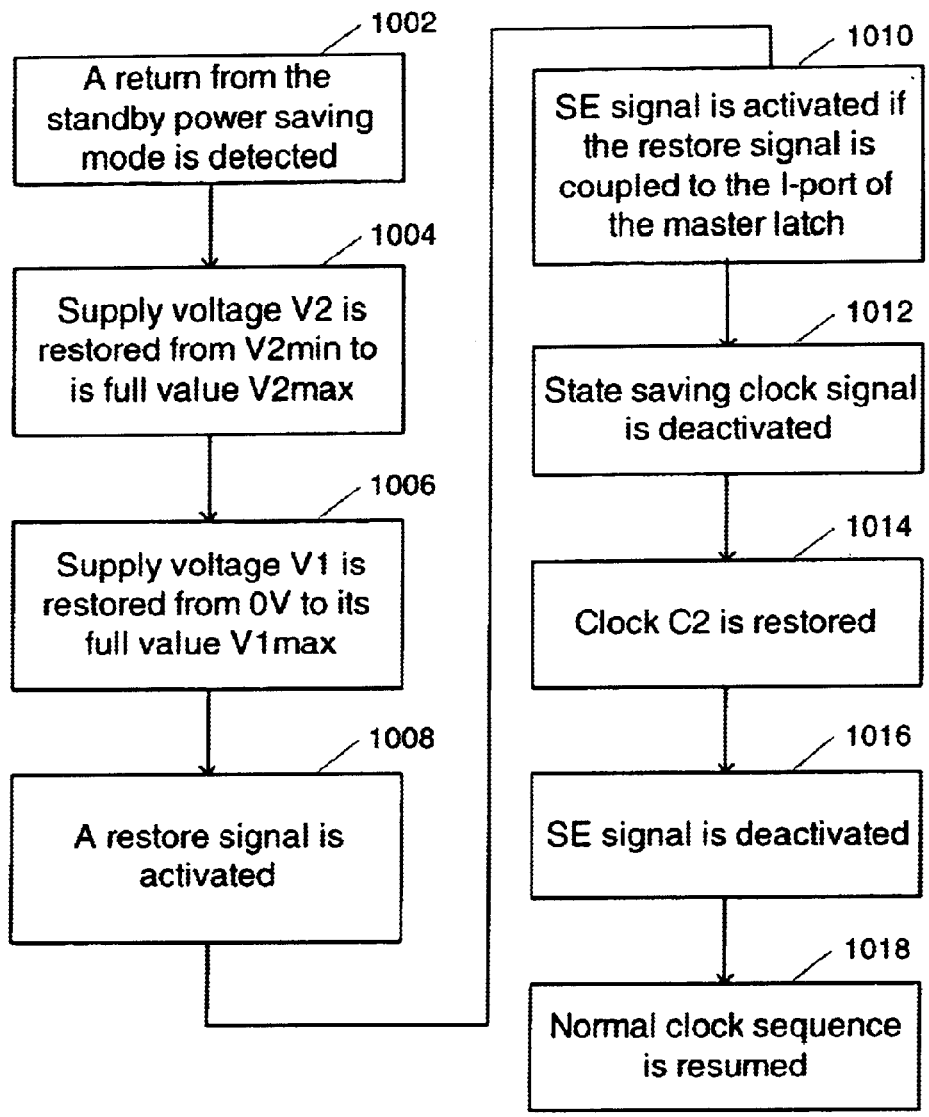
FIG. 10 is a flowchart which illustrates a method for returning to normal mode from power saving mode utilizing FF.

FIG. 10 is a flowchart which illustrates a method for returning to normal mode from power saving mode utilizing FF 600". First, a return from the standby power saving mode is detected, via step 1002. Next, the supply voltage 609" is restored V2min to its full value V2max, via step 1004. Then, the supply voltage 607" is restored from 0V to its full value V1 max, via step 1006. Next, a restore signal is activated, via step 1008. Then, an SE signal is activated if the restore signal is coupled to the I-port of the master latch, via step 1010. The state saving clock signal is deactivated, via step 1012. The clock C2 is restored, via step 1014. The SE signal (which may be different depending on implementation) is deactivated, via step 1016. Finally, normal clock sequence is resumed, via step 1018.

Hence, a simple means to optimize power consumption in random logic latch configurations with or without clock gating has been disclosed. According to the method and circuit disclosed herein, the present invention provides numerous benefits. For example, it preserves the data in a FF during a power savings mode.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A flip-flop comprising:
   a first latch coupled to a first power supply; and
   a second latch coupled to the first latch and coupled to a second power supply, wherein the first and second power supplies are independently controllable to minimize power consumption when the flip-flop is in a power saving mode; and
   a state saving latch which is coupled to the second power supply and is only activated upon detection of standby power saving mode wherein the contents of the first latch are loaded into the state saving latch, wherein the first power supply is reduced to 0 volts and the second power supply is reduced to minimum voltage to sustain the state.

2. The flip-flop of claim 1 wherein, in a power saving mode, the voltage of at least one of the first and second power supplies is reduced.

3. The flip-flop of claim 1 wherein, in a power saving mode, the voltage of the power supply coupled to the latch which contains contents to be preserved is reduced to a voltage to preserve the state of the contents and the other power supply is reduced to substantially zero volts.

4. The flip-flop of claim 1 wherein the first latch is a master latch.

5. The flip-flop of claim 1 wherein the second latch is a slave latch.

6. The flip-flop of claim 1 further comprising a first clock coupled to the first latch and a second clock coupled to the second latch.

7. The flip-flop of claim 6 wherein the first clock and the second clock are free running.

8. The flip-flop of claim 6 wherein the first clock is gated and the second clock is free running.

9. The flip-flop of claim 6 wherein the first clock is free running and the second clock is gated.

10. The flip-flop of claim 6 wherein the first clock is gated and the second clock is gated.

11. A flip-flop comprising:
    a first latch coupled to a first power supply, the first latch for receiving at least one bit;
    a second latch coupled to the first latch and coupled to a second power supply, the second latch for storing the at least one bit from the first latch, wherein the size of the second latch is minimized to reduce power consumption;
    a multiplexor coupled to the first latch and to the second latch for outputting the at least one bit from the first latch when a clock to the multiplexor is active and for outputting the at least one bit from the second latch when the clock is inactive, wherein the first and second power supplies are independently controllable; and
    a state saving latch which is coupled to the second power supply and is only activated upon detection of standby power saving mode, wherein the contents of the first latch are loaded into the state saving latch, wherein the first power supply is reduced to 0 volts and the second power supply is reduced to minimum voltage to sustain the state.

12. The flip-flop of claim 1 wherein, in a power saving mode, the voltage of at least one of the first and second power supplies is reduced.

13. The flip-flop of claim 1 wherein, in a power saving mode, the voltage of the power supply coupled to the latch which contains contents to be preserved is reduced to a voltage to preserve the state of the contents and the other power supply is reduced to substantially zero volts.

14. The flip-flop of claim 11, wherein the multiplexor is a shunt multiplexor.

15. The flip-flop of claim 11 wherein a first clock causes the at least one bit to be provided to the first latch.

16. The flip-flop of claim 11 wherein the first latch is a master latch.

17. The flip-flop of claim 16 wherein the second latch is a slave latch.

18. The flip-flop of claim 17 which includes a restore mechanism which multiplexes the data and an output of the slave latch to enable recovery of the state of the contents of the master latch.

19. A flip-flop comprising:
    a master latch adapted to be coupled to a first power supply, the master latch for receiving at least one bit; and
    a slave latch coupled to the master latch and coupled to a second power supply, the slave latch for storing the at least one bit from the master latch wherein the size of the latch is minimized to reduce power consumption;

a shunt multiplexor coupled to the master latch and to the slave latch for outputting the at least one bit from the master latch when a clock to the multiplexor is active and for outputting the at least one bit from the slave latch when the clock is inactive, the voltage of the power supply coupled to the latch which contains contents to be preserved is reduced to a voltage to preserve the state of the contents and the other power supply is reduced to substantially zero volts; and a state saving latch which is coupled to the second power and is only activated upon detection of standby power saving mode; the voltage of the power supply coupled to the state saving latch which contains contents to be preserved is reduced to a voltage to preserve the state of the contents and the other power supply is reduced to substantially zero volts.

20. The flip-flop of claim 19 which includes a restore mechanism which multiplexes the data and an output of the slave latch to enable recovery of the state of the contents of the master latch.

21. A flip-flop comprising:

a master latch coupled to a first power supply, the master latch for receiving at least one bit; and a slave latch coupled to the master latch and coupled to a second power supply, the slave latch for storing the at least one bit from the master latch wherein the size of the latch is minimized to reduce power consumption;

a shunt multiplexor coupled to the master latch and to the slave latch for outputting the at least one bit from the master latch when a clock to the multiplexor is active and for outputting the at least one bit from the slave latch when the clock is inactive, the voltage of the power supply coupled to the latch which contains contents to be preserved is reduced to a voltage to preserve the state of the contents and the other power supply is reduced to substantially zero volts;

a restore mechanism which multiplexes a data and an output of the slave latch to enable recovery of the state of the contents of the master latch; and a state saving latch which is coupled to the second power supply and is only activated upon detection of the power saving mode, the voltage of the power supply coupled to the state saving latch which contains contents to be preserved is reduced to a voltage to preserve the state of the contents and the other power supply is reduced to substantially zero volts.

22. A method for minimizing the power consumption of a flip-flop, the flip-flop including a first latch and a second latch coupled thereto; the method comprising the steps of:

(a) providing a first independently controllable power supply coupled to the first latch;

(b) providing a second independently controllable power supply coupled to the second latch; and (c) reducing the voltage of at least one of the first and second power supplies responsive to the detection of a power saving mode wherein, in a power saving mode, the voltage of the power supply coupled to a state saving latch which contains contents to be preserved is reduced to a voltage to preserve the state of the contents and the other power supply is reduced to substantially zero volts.

23. The method of claim 22 wherein the first latch is a master latch.

24. The method of claim 23 wherein the second latch is a slave latch.

25. The method of claim 24 further comprising a first clock coupled to the first latch and a second clock coupled to the second latch.

* * * * *